US007065172B2

(12) United States Patent
Xiu et al.

(10) Patent No.: US 7,065,172 B2
(45) Date of Patent: *Jun. 20, 2006

(54) PRECISION JITTER-FREE FREQUENCY SYNTHESIS

(75) Inventors: Liming Xiu, Plano, TX (US); Zhihong You, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 216 days.

This patent is subject to a terminal disclaimer.

(21) Appl. No.: 10/376,453

(22) Filed: Feb. 26, 2003

(65) Prior Publication Data

US 2004/0008805 A1  Jan. 15, 2004

Related U.S. Application Data

(60) Provisional application No. 60/395,882, filed on Jul. 15, 2002.

(51) Int. Cl.
  *H03D 3/24*  (2006.01)

(52) U.S. Cl. .................. 375/376; 327/147; 327/156; 708/271

(58) Field of Classification Search ............... 375/376, 375/375; 327/147, 156, 105; 708/271
See application file for complete search history.

(56) References Cited

U.S. PATENT DOCUMENTS 6,081,164 A * 6/2000 Shigemori et al. ............ 331/16
6,329,850 B1 12/2001 Mair et al.
6,366,174 B1 * 4/2002 Berry et al. ................... 331/78
2001/0005408 A1 * 6/2001 Neukon ....................... 375/376

OTHER PUBLICATIONS

Xiu et al., "A 'Flying-Adder' Architecture of Frequency and Phase Synthesis with Scalability", *Trans.on VLSI Sys.*, vol. 10, No. 5 (IEEE, Oct. 2002), pp. 637-649.

Mair et al., "An Architecture of High-Performance Frequency and Phase Synthesis", *J. of Solid State Cir.*, vol. 35, No. 6 (IEEE, Jun. 2000), pp. 835-846.

* cited by examiner

*Primary Examiner*—Temesghen Ghebretinsae
(74) *Attorney, Agent, or Firm*—W. James Brady, III; Frederick J. Telecky, Jr.

(57) ABSTRACT

An electronic system (10) includes a phase-locked loop (30) and a frequency synthesis circuit (20), for generating a jitter-free output clock (CLK1, CLK2) at a desired frequency. The phase-locked loop (30) includes a voltage-controlled oscillator (37) that produces a number (N) of equally spaced clock phases at a frequency ($f_{VCO}$) that depends also upon a programmable feedback frequency divider (38) and a prescale divider (32). The frequency synthesis circuit (20) generates the output clock (CLK1, CLK2) at a frequency under the control of a frequency select word (FREQ) that indicates the number of clock phases between successive clock edges. A central processing unit (12), either itself or from a look-up table (13), generates a feedback divide integer (M) and the frequency select word (FREQ) according to a desired frequency (f), by way of a minimization of the frequency error. The frequency of the output clock (CLK1, CLK2) can be generated in a jitter-free manner, since only integer values are used in the frequency synthesis circuit (20), at relatively low frequency error.

26 Claims, 6 Drawing Sheets

PRECISION JITTER-FREE FREQUENCY SYNTHESIS

CROSS-REFERENCE TO RELATED APPLICATIONS

This application claims priority, under 35 U.S.C. §119(e), of Provisional Application No. 60/395,882, filed Jul. 15, 2002.

STATEMENT REGARDING FEDERALLY SPONSORED RESEARCH OR DEVELOPMENT

Not applicable.

BACKGROUND OF THE INVENTION

This invention is in the field of integrated circuits, and is more specifically directed to clock synthesis circuits for generating periodic signals at selected frequencies for use in integrated circuits.

As is fundamental in the art, many modern electronic systems now include numerous integrated circuits that operate in conjunction with one another. In complex high performance systems such as modern personal computers and workstations, these integrated circuits are synchronized with a system clock. In consumer-oriented systems such as televisions and home theaters, for example, system operation is synchronized with respect to a synchronization pulse that is included within the display signal itself. Modern spread-spectrum communications transmitters and receivers require the generation of high-frequency clock signals for the modulation and demodulation, respectively, of signals over the multiple subchannels of the spread spectrum bandwidth. In these and other electronic systems, the generation of periodic signals for clocking the operation of circuit functions based upon a system clock or synchronization pulse, is a common and often critical function.

A conventional approach for generating periodic signals based upon a reference clock utilizes the well-known phase-locked loop, or PLL. In general, PLL circuits operate by comparing the time at which an edge of a reference clock is received relative to a corresponding edge of an internally generated clock. If a significant delay between these two edges is detected, the generation of the internal clock is adjusted to more closely match the received reference clock. In conventional analog PLLs, the frequency of a voltage controlled oscillator is adjusted by a filtered signal from a phase detector that compares system and chip clocks, so that the instantaneous frequency of the internal chip clock is advanced or retarded depending upon whether the chip clock lags or leads the system clock. Analog PLLs therefore adjust the phase of the chip clock in a substantially continuous manner in response to a phase difference between the internal chip clock and the system clock. This smooth operation generally depends upon the filtering of the output of the phase detector circuit, but can be made quite well-behaved in most implementations. Additionally, by inserting frequency dividers in the forward and feedback loops, analog PLLs can be used to generate periodic signals of a selectable frequency multiple of the input reference clock.

Modern digital integrated circuits generally use digital circuitry to generate multiple internal chip clocks that are based upon the output of a PLL. However, these digitally-generated clock signals can only be adjusted to a discrete accuracy that corresponds to the minimum step size of the digital clock generation circuitry. This incremental change in phase is often noticeable, particularly at high frequencies. The resulting "phase jitter" is now a commonly specified parameter for digital clock circuitry, as this effect is often a limiting factor in the accuracy and performance of the circuit.

Known clock generator circuits based on a phase-locked loop (PLL) are described in Mair and Xiu, "An Architecture of High-Performance Frequency and Phase Synthesis", *J. Solid State Circ.*, Vo. 35, No. 16 (IEEE, June, 2000), pp. 835–46, and in U.S. Pat. No. 6,329,850 B1, issued Dec. 11, 2001 and commonly assigned herewith, both documents incorporated herein by this reference. In these "flying-adder" clock generation circuits, the voltage controlled oscillator (VCO) of the PLL produces a plurality of evenly-spaced output phases at a frequency that is locked to a reference clock. A register stores a digital value that selects the desired phase to be applied to the clock input of a toggle flip-flop from which the output clock is generated. A frequency synthesis circuit adds integer and fraction portions of an incoming frequency selection value to the current contents of the register. The fraction portion of the frequency selection value permits a time-averaged clock frequency to be produced with more precision than would be attained by the integer portions selecting the multiple VCO output phases. This article and U.S. Patent also describe alternative realizations, including multiple frequency synthesis circuits based upon the same PLL and the generation of a phase-shifted secondary output from a phase synthesis circuit that is slaved to the frequency synthesis circuit. Additional performance is obtained by providing separate paths for producing the leading and trailing edges of the output clock.

FIG. 1 illustrates an example of one of the frequency synthesis circuits described in the Mair and Xiu article. In FIG. 1, clock generation circuit 122 includes PLL 125, frequency synthesis circuit 127 for generating a clock signal on line COUT that is at a selected frequency, and phase synthesis circuit 129 for generating a second clock signal on line CSHOUT that is in a fixed phase relationship, and identical frequency, with the clock signal on line COUT. In frequency synthesis circuit 127, thirty-two equally spaced clock phases generated by a VCO in PLL 125 are received at inputs of multiplexer 134. The selected one of the clock phases indicated by select lines SEL appears at the output of multiplexer 134 and is applied to the clock input of D-type flip-flop 136, which is connected in toggle fashion. This inverting output of flip-flop 136 drives the output clock signal on line COUT.

The selection of clock phases by multiplexer 134 according to this preferred embodiment of the invention is determined by an input value presented on lines FREQ, which include both an integer portion and a fractional portion, and is applied to one input of adder 138. The integer portion has a number of bits corresponding to the number of select lines SEL, and thus corresponding to the number of clock phases output by PLL 125. The fractional portion provides additional resolution in the selection of the time-averaged frequency of the output clock signal on line COUT. Adder 138 adds the digital value on lines FREQ with a feedback value from the current output of register 140, and applies this sum to register 140, which is clocked by the output of multiplexer 134. The output of the integer portion of register 140 drives lines SEL applied to multiplexer 134, while the outputs of the integer register and the fraction register of register 140 are together combined into a ten-bit value that is applied back to adder 138 as feedback. In this way, adder 138 adds the current contents of register 140, which includes the current phase selection state applied to multiplexer 134 on lines SEL, to the frequency selection value on lines FREQ, for use in the selection of the next clock phase.

Phase synthesis circuit 129 includes multiplexer 144 which receives the multiple phases generated by PLL 125, and forwards a phase, selected by the digital value on lines SELPH, to the clock input of D-type flip-flop 146. The D input of flip-flop 146 receives the non-inverting output of flip-flop 136 in frequency synthesis circuit 127, and generates the output clock signal on line CSHOUT from its inverting output. Lines SELPH are generated from register 143, which receives a value from adder 142 corresponding to the sum of the current value of lines SEL of frequency synthesis circuit 127 and a digital input value presented on lines PHASE from control circuitry elsewhere within the device.

In operation, the digital value on lines FREQ thus corresponds to the number of phases output from PLL 125 that are to elapse between successive edges of the output clock signal on line COUT. The fractional component of this value provides additional precision in the average output frequency, because these fractional values accumulate and carry in such a manner as to modulate the integer output on lines SEL, and thus modulate the position of the clock edges selected by multiplexer 134. The digital value on lines PHASE indicating the desired phase relationship between the clock signals on lines COUT, CSHOUT is added by adder 142 with the current value of the phase presented on lines SEL; the resulting sum is stored in register 143 and is presented to multiplexer 144 on lines SELPH. Multiplexer 144 then selects the corresponding phase from PLL 125 for application to the clock input of flip-flop 146. Upon the rising transition of this selected clock phase, flip-flop 146 stores the current contents of flip-flop 136 (non-inverted) and applies this state at its inverting output on line CSHOUT.

The Mair and Xiu article and the above-referenced U.S. Pat. No. 6,329,850 B1 each also describe another implementation of a frequency synthesis circuit in which the clock signal is generated in a pipelined manner, by way of separate paths for generating leading and trailing edges of the output clock signal. Each of the paths in this example includes a multiplexer for selecting one of the equally-spaced clock phases output by the voltage controlled oscillator (VCO) in a conventional phase-locked loop (PLL). Logic circuitry at the output of each of the multiplexers are interlocked so that one of the multiplexers drives the output clock leading edge, and the other drives the trailing edge. By providing two separate paths, each path is permitted time to perform the necessary operations to generate its next edge during such time as the other clock edge is being generated by the other path. Specifically, during such time as the rising edge of the output clock is being generated through one path, the other path is updating the value to be applied to its multiplexer to select the output phase for its next edge.

The circuits of the Mair and Xiu article and U.S. Pat. No. 6,329,850 B1, provide important improvements in the generation of clock signals in integrated circuits, including precise selection of clock frequencies with minimal drift, with performance suitable for applications requiring extremely high frequency accuracy. However, certain limitations are present in these circuits. For example, not all possible phase shifts are available for all clock edges, because of the propagation delay through the selection circuitry. Furthermore, these circuits must operate according to various timing constraints.

By way of further background, our copending application Ser. No. 10/026,489, filed Dec. 24, 2001, describes improved clock generation circuits based on the "flying-adder" architecture of the Mair and Xiu article and U.S. Pat. No. 6,329,850 B1. In particular, this copending application describes a clock generation circuit in which two or more frequency synthesis paths terminate at the inputs of a multiplexer, the output of which toggles a toggle mode bistable multivibrator (T flip-flop). Sequential selection of the synthesis paths is controlled in a synchronized manner with the output of the circuit, so that the synthesis path outputs sequentially toggle the flip-flop. In this way, the number of synthesis paths can be increased arbitrarily, with the scaling limited by the performance of control circuits for the output multiplexer. The propagation delay paths of each synthesis path can then extend to the multiple periods of the output clock, making higher output frequency possible. In addition, the toggle signal operates as a double-frequency clock signal.

Each of these conventional circuits are vulnerable to jitter, however. The jitter in the output clock is produced at those cycles in which the sum or sums applied to the select multiplexers vary from one cycle to the next. In the case of FIG. 1, by way of example, jitter is caused by the generation of a carry from the fraction portion of the sum produced by adder 138 and forwarded through register 140 to select lines SEL applied to multiplexer 134. For example, if the frequency select signal is 5.25 (i.e., an average of 5.25 clock phases between adjacent edges), the integer result will increment by five in three out of four cycles, and by six in the fourth cycle. The count of phases between successive clock edges selected by multiplexer 134 will vary in this same manner, causing jitter in the output clock.

BRIEF SUMMARY OF THE INVENTION

It is therefore an object of this invention to provide a clock synthesis circuit and method of synthesizing a clock signal that provides a selectable clock frequency with no jitter.

It is a further object of this invention to provide such a circuit and method in which many different frequencies can be readily selected.

It is a further object of this invention to provide such a circuit and method in which the error between the generated jitter-free frequency and the desired frequency is bounded.

It is a further object of this invention to provide a method of designing such a circuit in which an error distribution envelope can be derived and used in the design of the circuit.

It is a further object of this invention to provide such a circuit and method in which phase-shifted versions of the output can be synthesized at any phase relationship relative to one another.

It is a further object of this invention to provide such a circuit and method in which a double frequency version of the synthesized output clock is made available.

Other objects and advantages of the present invention will be apparent to those of ordinary skill in the art having reference to the following specification together with its drawings.

The present invention may be implemented in a clock synthesis circuit in which one or more frequency synthesis circuits utilize a "flying-adder" architecture, in which multiple available phases from a phase-locked loop are selectable according to a digital frequency select signal. According to this invention, a feedback frequency divide value within the phase-locked loop and a digital frequency select signal are selected in a manner that minimizes the frequency error between the generated clock signal and its desired frequency. The actual output frequency is thus determined from the combination of these values that directly generates, or most closely approximates, the desired frequency.

DETAILED DESCRIPTION OF THE INVENTION

An exemplary implementation of the present invention in a generalized system environment will now be described. Those skilled in the art having reference to this specification will understand that this invention may be used in connection with a wide variety of applications. Examples of these systems include broadband or spread-spectrum transceivers, computer systems, video decoding and display systems, communications devices such as wireless telephone handsets, modems, and switching systems, and many others. These exemplary applications are noted because of their need for selectable frequency operation, particularly in the transmission and receipt of signals at multiple frequencies. The enumeration of these systems is presented by way of example only, and is not intended to limit the true scope of this invention as claimed.

Figure 1:
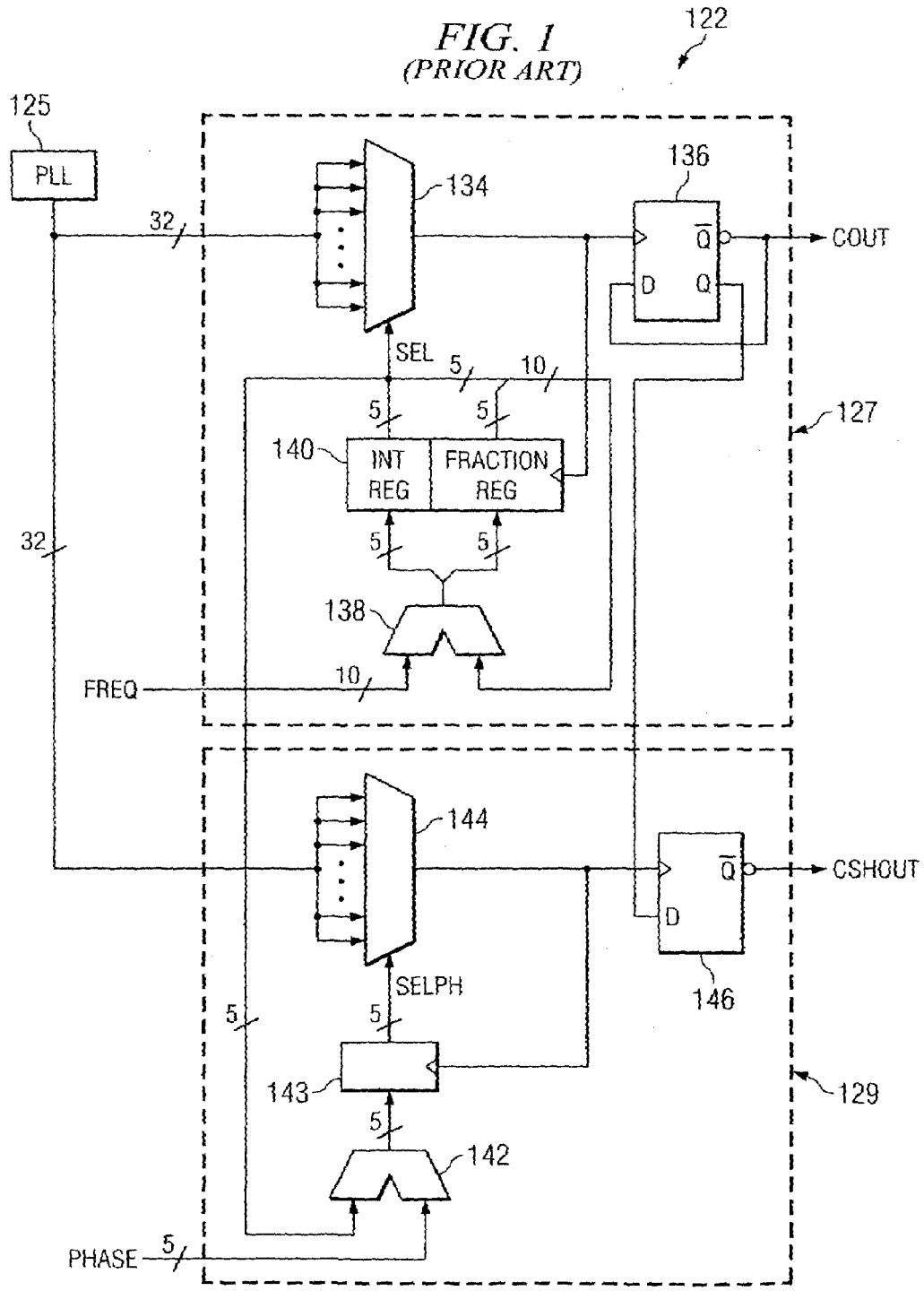
FIG. 1 is an electrical diagram, in schematic form, of a clock and phase synthesis circuit according to the prior art.

Prior to the detailed description of the clock generation circuit according to the preferred embodiment of the invention, however, it is useful to comprehend the theory behind this invention. Reference is made to the "flying-adder" clock generation circuits of the Mair and Xiu article and the above-referenced U.S. Pat. No. 6,329,850 B1 described above relative to FIG. 1, and also in copending application Ser. No. 10/026,489, filed Dec. 24, 2001 and in Xiu and You, "A 'Flying-Adder' Architecture of Frequency and Phase Synthesis with Scalability", *Trans. on VLSI Systems*, Vol. 10, No. 5 (IEEE; October, 2002), pp. 637–49, all incorporated herein by this reference. As described in these documents and as described above, the flying-adder circuit is based on a phase-locked loop that includes a voltage-controlled oscillator that produces N uniformly-spaced clock phases at an output clock frequency $f_{VCO}$. A digital word FREQ sets the number of clock phases, on the average, between successive ones of the N clock phases to be used to generate the output clock; the digital word FREQ includes integer and fractional parts, and is accumulated over time so that the integer portion of the accumulated sum effectively selects the next one of the N clock phases to use as the output clock edge. In this arrangement, one can derive the "frequency formula" for generating a clock signal of period T and frequency 1/f as follows:

$$T=1/f=FREQ*\Delta \quad (1)$$

where $\Delta$ is the time between adjacent clock phases output by the phase-locked loop (e.g., PLL 125 of FIG. 1). This frequency formula can also be expressed as:

$$FREQ=T/\Delta \quad (2)$$

This assumes a two-path frequency synthesis circuit, where a separate adder is used for generating each of the leading and trailing edges of the clock. One can also determine the range of the synthesizable frequency $f_z$ in this architecture as follows:

$$\frac{1}{2}f_{VCO} \le f_z \le \frac{N}{2}f_{VCO} \quad (3)$$

In practice, the maximum synthesizable frequency $f_z$ may not reach its maximum stated in equation (3), because of timing constraints in the circuit.

In this situation, one can express the peak-to-peak jitter $J_{p\text{-}p}$ as:

$$J_{p\text{-}p}=\Delta \quad (4)$$

considering that the jitter is due to a carry from one of the adders, and is thus always one clock phase shorter (or longer). The mean jitter $J_{mean}$ is zero, considering that, over many cycles, the average frequency approaches the frequency of digital word FREQ in these circuits. The root-mean-square jitter $J_{rms}$ can be derived:

$$J_{rms}=\Delta\sqrt{r-r^2} \quad (5)$$

where r is the fractional portion of the digital frequency word FREQ, in decimal form.

Similarly, one can investigate the frequency resolution attainable by the flying-adder clock circuit. From equation (2) one can derive a period resolution $\delta T$:

$$\delta T=2^{-k}*\Delta \quad (6)$$

where k is the number of bits in the fractional part of digital frequency word FREQ. Because T=1/f, one can derive a frequency resolution $\delta f$:

$$\delta T=-\delta f/f^2 \quad (7)$$

or, with reference to equation (6):

$$|\delta f|=2^{-k}*\Delta*f^2 \quad (8)$$

Consider an example of a VCO frequency $f_{VCO}$=114.54544 MHz, and N=32 (i.e., thirty-two clock phases are outputted by the VCO), then $\Delta$=0.272818 nsec. For a digital word FREQ having a twenty-seven bit fractional part, then k=27, the frequency resolution $\delta f$ in the neighborhood of frequency f=160 MHz will be about:

$$\delta f=2^{-k}*\Delta*f^2=2^{-27}*0.272818\times10^{-9} \text{ sec}*(160\times10^6 \text{ Hz})^2=0.052036 \text{ Hz} \quad (9)$$

As evident from this description, the frequency resolution $\delta f$ is a (squared) function of the output frequency f itself. At lower frequencies, the frequency resolution increases.

From this discussion, it is apparent that the use of the fractional portion of the digital frequency word FREQ provides reasonable frequency resolution in these conventional flying-adder frequency synthesis circuits. However, the carry-in from the accumulation of the fractional portions of the digital word FREQ from cycle to cycle directly results in jitter in the output clock signal. According to the preferred embodiment of the invention, however, only an integer digital select word FREQ is used, eliminating the jitter from the output clock signal. In addition, the frequency error relative to the desired frequency is bounded, and can be controlled to a very low level.

Figure 2:
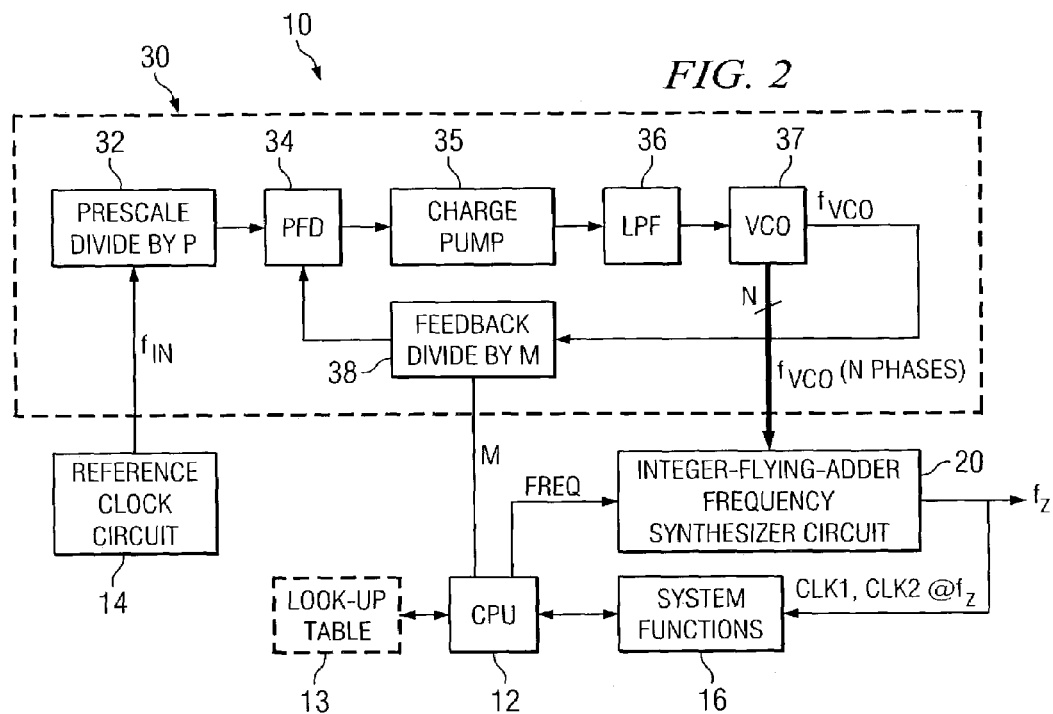
FIG. 2 is an electrical diagram, in block form, of a clock generation circuit and its control circuitry, constructed according to the preferred embodiments of the invention.

Referring now to FIG. 2, electronic system 10 constructed according to the preferred embodiment of the invention will now be described. System 10 is illustrated in a generic manner, because it is contemplated that this invention will be beneficial in a wide range of system applications. In this regard, system 10 includes central processing unit 12, which is a conventional programmable or custom logic device, examples of which include programmable microprocessors such as an OMAP processor available from Texas Instruments Incorporated, a digital signal processor such as a member of the TMS320C5x and TMS320C6x families, also available from Texas Instruments Incorporated, other programmable devices, and custom logic circuitry. System 10 also includes system function 16, which is a generic reference to such other circuitry within system 10 that is provided for carrying out the particular function of the system. For example, it is contemplated that this invention will be of particular benefit in spread spectrum communications systems such as modems, in which case system function 16 will refer to such circuits as radio frequency (RF) circuitry, baseband digital processing circuitry, codec functions, and the like. As mentioned above, however, this invention is contemplated to be broadly applicable over a wide range of system applications, particularly those in which high precision clock signals of a selectable frequency are useful. Examples of such systems include video decoders, other types of communications and switching systems, as well as conventional computer systems that operate according to a high precision clock. It is contemplated that this invention will have a broad applicability to these and other system applications.

As shown in FIG. 2, system 10 also includes reference clock circuit 14, which produces a reference clock signal of frequency $f_{in}$. Reference clock circuit 14 may be of conventional construction and type, for example as a conventional oscillator circuit that uses an external crystal to set its frequency of oscillation. Those skilled in the art having reference to this description will be readily able to construct and implement the appropriate reference clock circuit 14 in system 10, according to the particular application.

Reference clock circuit 14 presents its reference clock $f_{in}$ to phase-locked loop (PLL) 30, specifically to prescale frequency divider 32 in PLL 30. As conventional in the art, prescale frequency divider 32 divides down the frequency of reference clock $f_{in}$ by an integer factor P, generating a reference clock to phase-frequency detector (PFD) 34. As will be apparent from the following description, a feedback clock is also applied to PFD 34. PFD 34 will produce an output signal responsive to the phase difference between the reference and feedback clocks, and this output signal is applied to charge pump 35. Specifically, PFD 34 compares the relative phases of the reference and feedback clocks, controlling charge pump 35 to produce a voltage corresponding to this phase difference. The output of charge pump 35 is low-pass filtered by filter 36, and applied to a control input of voltage controlled oscillator (VCO) 37. VCO 37 generates a periodic signal at a frequency $f_{VCO}$ that is established by the voltage of the input it receives from charge pump 35 via filter 36. According to this embodiment of the invention, as in the Mair and Xiu article, U.S. Pat. No. 6,329,850 B1, copending application Ser. No. 10/026,489, and in the Xiu and You article, VCO 37 generates this periodic signal at multiple phases, in this example N phases of substantially uniform delay Δ relative to one another.

The N phases from VCO 37 are applied to integer-flying-adder frequency synthesizer circuit 20, as shown in FIG. 2. In addition, one of these phases is applied to feedback frequency divider 38, which divides down the VCO frequency $f_{VCO}$ by an integer factor M. According to the preferred embodiment of the invention, integer factor M is calculated by CPU 12 to set a VCO frequency $f_{VCO}$ that, in conjunction with digital word FREQ, most closely approximates or exactly equals the desired ultimate output frequency f. The divided down output signal is then applied as a feedback signal to PFD 34, which compares the phase to that of the reference clock from prescale divider 32, and which generates an output signal to charge pump 35 accordingly. The construction and operation of integer-flying-adder frequency synthesizer circuit 20 will be described in detail below.

Prescale divider 32 and feedback divider 38 operate in the conventional manner to define the relationship of frequency $f_{VCO}$ to reference clock $f_{in}$. As known in the art, PLL 30 modifies the output frequency $f_{VCO}$ until the phase of the feedback and reference clocks received by PFD 34 match one another. Including the effects of prescale divide ratio P and feedback divide ratio M, the operation of PLL 30 is stable when:

$$\frac{f_{in}}{P} = \frac{f_{VCO}}{M} \qquad (10)$$

or, expressing the ratio of reference frequency $f_{in}$ to output frequency $f_{VCO}$:

$$\frac{f_{VCO}}{f_{in}} = \frac{M}{P} \qquad (11)$$

or still further:

$$f_{VCO} = \frac{M}{P} f_{in} \qquad (12)$$

Figure 3:
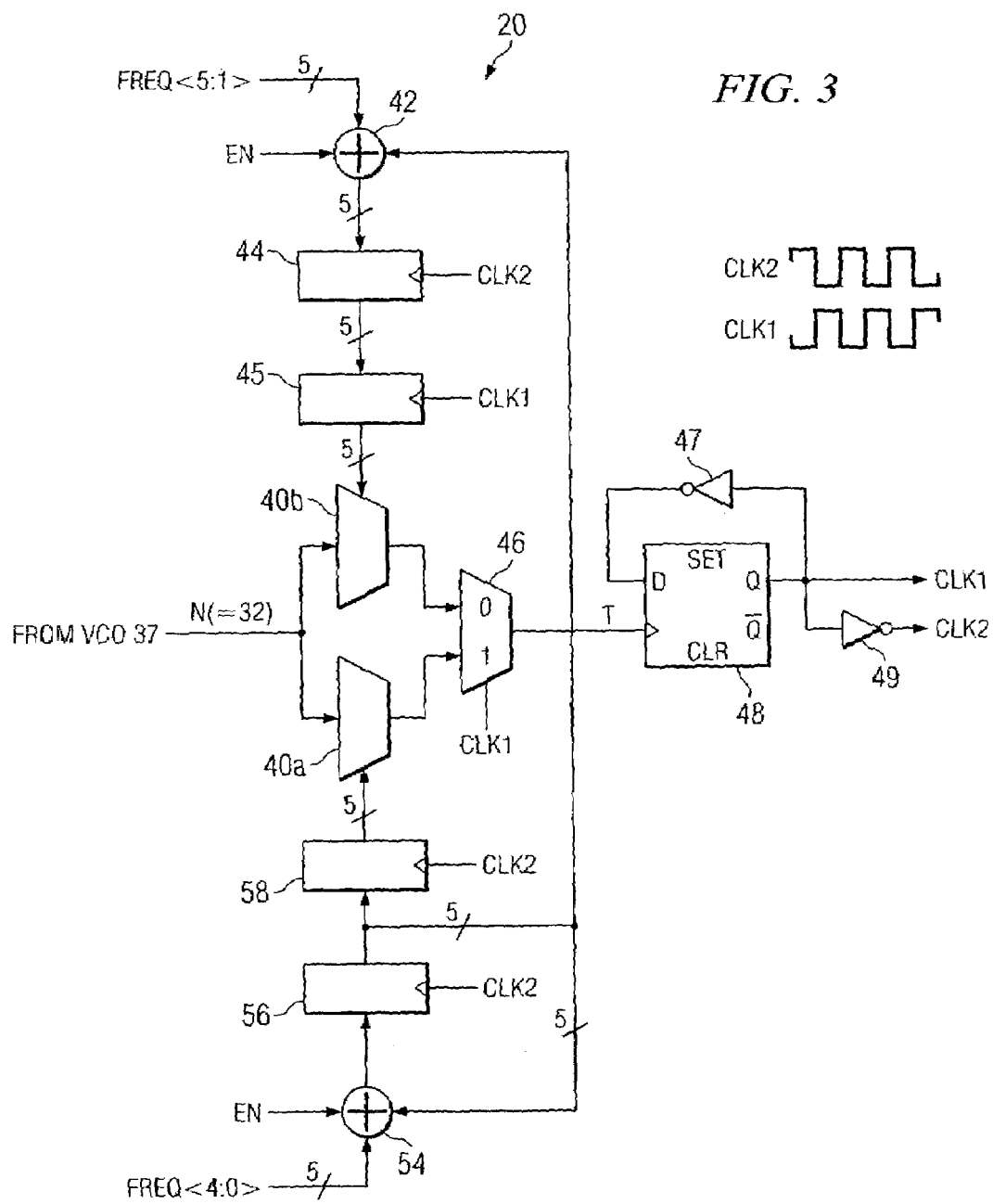
FIG. 3 is an electrical diagram, in schematic and block form, of a flying-adder clock synthesizer circuit implemented in the circuit of FIG. 2, according to the preferred embodiment of the invention.

As shown in FIG. 2 and as mentioned above, the N phases of the output clock at frequency $f_{VCO}$ are applied to integer-flying-adder frequency synthesizer circuit 20. In addition, digital selection word FREQ is applied to integer-flying-adder frequency synthesizer circuit 20 by CPU 12, in system 10 according to this embodiment of the invention. Referring now to FIG. 3, the construction and operation of integer-flying-adder frequency synthesizer circuit 20 will now be described, for the exemplary case in which thirty-two phases (N=32) are applied to a two-path integer-flying-adder frequency synthesizer circuit 20.

As shown in FIG. 3, integer-flying-adder frequency synthesizer circuit 20 derives output clock signals CLK1, CLK2 at a selected frequency $f_c$, based on selected output clock phases from VCO 37 in PLL 30. While only a single integer-flying-adder frequency synthesizer circuit 20 is illustrated in FIG. 2, multiple integer-flying-adder frequency synthesis circuits 20 may be implemented to generate multiple frequencies based on the same PLL 30, following the arrangement illustrated in copending application Ser. No. 10/026,489. One or more of the multiple integer-flying-adder frequency synthesis circuits 20 may be arranged to generate an output clock signal at the same frequency as circuit 20, but at a different phase, also as described in copending application Ser. No. 10/026,489.

In circuit 20, the N (thirty-two, in this example) clock phases from VCO 37 in PLL 30 are applied to inputs of multiplexers 40a, 40b, which in turn select one of the clock phases responsive to values applied by registers 58, 45, respectively. While two such multiplexers 40a, 40b are illustrated in the example of FIG. 3, more than two such multiplexers may be involved in generating the output signal, as described in copending application Ser. No. 10/026,489. The outputs of these multiplexers 40a, 40b are connected to inputs of output multiplexer 46, which selects between these signals responsive to the state of clock signal CLK1, for application to the clock input of D-type flip-flop (bistable multivibrator) 48, connected in toggle fashion with its output connected to its input via inverter 47. Each rising edge received at the clock input of flip-flop 48 from multiplexer 46 causes flip-flop 48 to toggle its Q output, which drives clock signal CLK1 directly and drives clock signal CLK2 via inverter 49.

In circuit 20 of FIG. 3, the phase selection by multiplexers 40a, 40b, is effected by two adder legs. A first leg for controlling multiplexer 40a includes adder 54, which receives five bits of the digital frequency select value FREQ <4:0>, and thus the number of clock phases that are to elapse between transitions of clock signal CLK1, CLK2. For this example, where thirty-two clock phases are output by VCO 37 and circuit 20 is constructed with two adder paths, digital frequency select value FREQ may range from 2 to 64, and as such is communicated as up to six digital bits FREQ<5:0>. Adder 54 uses the five least significant bits FREQ<4:0> of digital frequency select value FREQ to generate one edge of the output clock signal, while the other adder path will use the five most significant bits FREQ<5:1> of value FREQ to generate the other edge. The second input to adder 54 is the previous sum generated by adder 54, as latched by register 56. This value corresponds to the sum generated by adder 54, and is applied by register 58 to the select inputs of multiplexer 40a.

In the second leg of integer-flying-adder frequency synthesizer circuit 20, adder 42 receives the five most significant bits FREQ<5:1> of the digital frequency select value FREQ. The sum stored in register 56 is also applied to adder 42 which, when enabled by enable signal EN, sums these two values and the result is stored in register 44 upon a rising edge of output clock signal CLK2. The contents of register 44 are then clocked into register 45 on the next rising edge of output clock signal CLK1, for presentation to the select input of multiplexer 40b. In this circuit 20, multiplexer 46 is controlled by output clock signal CLK1, so that the output of multiplexer 40b is forwarded responsive to output clock signal CLK1 being low ("0") and the output of multiplexer 40a is forwarded responsive to output clock signal CLK1 being high ("1").

In operation, the digital word selecting the output frequency of output clock signals CLK1, CLK2 is presented by CPU 12 on lines FREQ <5:0>. Adders 54, 42 add their corresponding bits of lines FREQ with the previous contents of register 56. Upon the next rising edge of output clock signal CLK2, the sums produced by adders 54, 42 are stored in registers 56, 44, respectively. The contents of register 44 then propagate to register 45. Also at this time, the contents of register 56 propagate to the input of register 58 and back to adder 54 in preparation for the next sum, and also to adder 42. Upon the first rising edge of output clock signal CLK1, the contents of register 45 propagate to the select input of multiplexer 40b. Conversely, upon the next rising edge of output clock signal CLK2, the contents of register 56 are stored in register 58, and the next sums from adders 54, 42 are clocked into registers 56, 44. Once the registers have been loaded in this fashion, succeeding clock edges of output clock signals CLK1, CLK2 also control the generation of the next cycles of these output clock signals. Between a rising edge of output clock signal CLK1 and a rising edge of output clock signal CLK2, multiplexer 46 forwards the clock phase selected by multiplexer 40a to the clock input of flip-flop 48; this selected clock phase, when it occurs, will toggle flip-flop 48, causing a falling edge of output clock signal CLK1 and a rising edge of output clock signal CLK2. The rising edge of output clock signal CLK2 (and corresponding falling edge of output clock signal CLK1) causes multiplexer 46 to forward the output of multiplexer 40b, and thus the clock phase selected by register 45, to be applied to the clock input of flip-flop 48. Once this clock edge occurs, output clock signals CLK1, CLK2 make another transition.

As apparent from FIG. 3, clock signals CLK1, CLK2 are 180° out of phase relative to one another. In this example, registers 44, 45, 56, 58 are clocked by rising edges of these clock signals, and the outputs of adders 42, 54 propagate through registers 44, 56, respectively, responsive to a rising edge of clock signal CLK2. In response to a rising edge of clock signal CLK1, the current output of register 44 propagates through register 45 to the control inputs of multiplexer 40b. During this half-cycle of clock signals CLK1, CLK2, however, output multiplexer 46 is selecting the output of multiplexer 40a, which is stable during this time, for application to the clock input of flip-flop 48. Conversely, in response to a rising edge of clock signal CLK2, the previous output of register 56 (i.e., from the prior rising edge of clock signal CLK2) propagates through register 58 and is thereafter applied to the control inputs of multiplexer 40a; during this half-cycle, in which clock signal CLK1 is low, output multiplexer 46 is selecting the stable output of multiplexer 40b for application to flip-flop 48. In this manner, frequency synthesis circuit 20 generates stable clock signals CLK1, CLK2, in a manner that is not closely constrained by circuit timing, and with each edge being selected by a stable control input value.

Referring back to FIG. 2, the frequency $f_z$ of the output clock signals CLK1, CLK2 is thus determined by the frequency $f_{VCO}$ from VCO 37, and the digital value FREQ from CPU 12. A particular advantage of this construction of integer-flying-adder frequency synthesis circuit 20 is that no fractional portion of the digital frequency select word FREQ is accumulated, as in prior circuits. This eliminates jitter in the frequency $f_z$ due to carries of the accumulated fractional portions, resulting in a stable output clock signal. This jitter-free operation is provided, according to this invention, in a manner that also allows very precise selection of the clock frequency without requiring fraction values in the select word, as will now be described in detail.

According to this embodiment of the invention, the feedback divide integer M applied to PLL 30 and the digital value FREQ are selected and controlled by CPU 12 to closely approximate, or in the best case directly generate, the desired frequency $f_z$ of clock signals CLK1, CLK2 that are applied to system functions 16. In this embodiment of the invention, the best value of feedback divide integer M, from the standpoint of frequency accuracy, is first iteratively determined, followed by the evaluation of the closest integer digital frequency select word FREQ that provides the most accurate frequency. Alternatively, one may iterate digital frequency select word FREQ, followed by evaluation of the corresponding feedback divide integer M. Further in the alternative, one may alternatively or additionally select prescale divide integer P in combination with digital value FREQ (and, perhaps, feedback divide ratio M) to accomplish the frequency selection.

As shown in FIG. 2, when PLL 30 is locked, its output frequency $f_{VCO}$ is determined by the prescale integer value P and feedback integer divider value M as stated in equation (12):

$$f_{VCO} = \frac{M}{P} f_{in} \quad (12)$$

Conversely, in terms of phase interval $\Delta$:

$$\Delta = \frac{T_{VCO}}{N} = \frac{P}{N * M * f_{in}} \quad (13)$$

For a desired output frequency f at a desired period T, the corresponding digital select word FREQ can be derived as a function of the PLL parameters, including feedback divide integer M, as follows, again considering that digital word FREQ is the number of clock phases $\Delta$ in each cycle of the desired clock frequency:

$$FREQ = \frac{T}{\Delta} = \frac{1}{f * \Delta} = \left(\frac{N * f_{in}}{f * P}\right) M \quad (14)$$

In this example, where N is thirty-two and circuit 20 includes two adder paths, the value of digital word FREQ may range from 2 to 64. According to this embodiment of the invention, referring back to FIG. 2, programmable feedback divider 38 is operable to divide the feedback clock frequency $f_{VCO}$ by an integer M that falls within a range $M_1$ to $M_2$, in increments of one. The generation of the output frequency f thus requires the selection of two integers, namely digital select word FREQ and feedback divide integer M that, when applied to equation (14), generates or most closely approximates the desired frequency f. Because the desired frequency f is proportional to the ratio of these two integers:

$$f = \left(\frac{N * f_{in}}{P}\right) \left(\frac{M}{FREQ}\right) \quad (15)$$

the desired frequency f can be achieved with zero error, for example by way of an algorithm following the Continued Fraction Approximation (CFA) approach, which is well-known in the art, assuming that all integer values are available for use as digital select word FREQ and feedback divide integer M. However, in a realizable system, not all integers are available. Indeed, as noted above, integer M is constrained to a range $M_1$ to $M_2$, and digital value FREQ depends on the number of available phases N from VCO 37 and the number of paths in circuit 20. Accordingly, these integers FREQ and M are selected according to an approximation method.

According to this embodiment of the invention, CPU 12 preferably executes a sequence of program instructions upon being commanded, either by a user or by another software routine, to control PLL 30 and circuit 20 to generate clock signals CLK1, CLK2 at a desired frequency f. This control is effected by CPU 12 in determining and applying the integer values M and FREQ to PLL 30 and circuit 20 in system 10. In the alternative, it is contemplated that other parameters, such as prescale integer value P, may alternatively or additionally be derived according to this sequence of program instructions.

As will be apparent from the following description, according to the preferred embodiment of the invention, it is contemplated that CPU 12 in system 10 will be readily able to execute this algorithm during system use, to derive the appropriate integer control parameters for a desired frequency f. As such, this description will refer to the operation of CPU 12 in determining the integer parameters M and FREQ upon receiving a desired frequency value f. Alternatively, it is contemplated that this algorithm may be executed in advance for a set of desired frequencies f that can be encountered by the system. For example, referring back to FIG. 2, a priori calculation of integer parameters M and FREQ as a function of desired frequency f (for example according to the method described below) may be performed, either by system 10 itself or off-line prior to the manufacture of system 10, with the values M and FREQ stored in optional look-up table 13 in a content-addressable manner. In operation, according to this alternative approach, upon CPU 12 receiving a desired frequency f command, CPU 12 applies a corresponding address to look-up table 13, responsive to which look-up table 13 returns the stored parameters M and FREQ for that desired frequency f. It is contemplated that these and other alternative implementations will be apparent to those skilled in the art having reference to this description.

Figure 4:
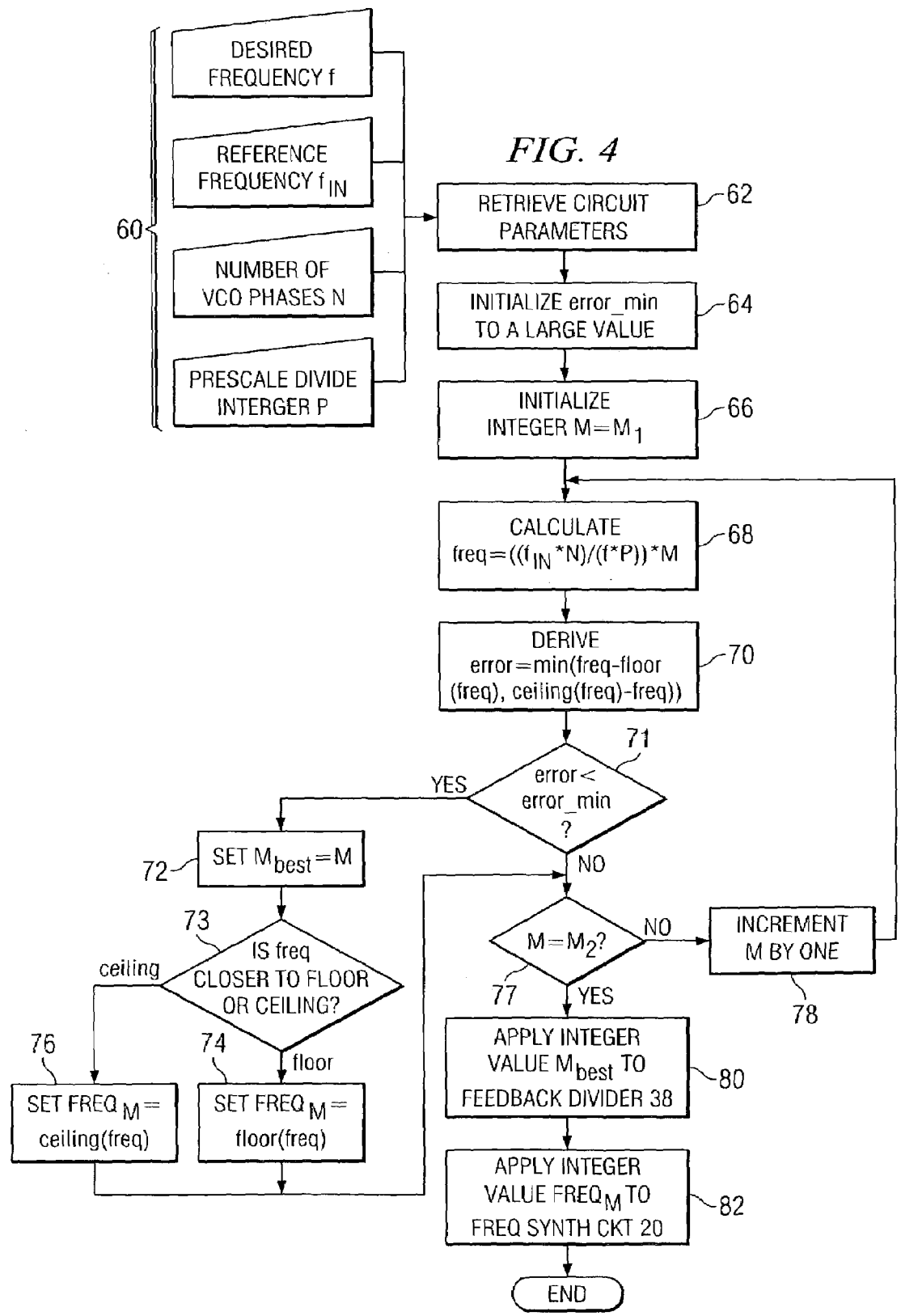
FIG. 4 is a flow chart illustrating the operation of selecting a feedback divide integer value and a frequency select word for application to the clock generation circuit of FIG. 2, according to the preferred embodiment of the invention.

FIG. 4 illustrates, in flow chart form, the operation of an algorithm, implemented as a sequence of instructions to be executed by CPU 12, for deriving the integer parameters M and FREQ for a given desired frequency f. In process 62, certain parameters 60 are retrieved by CPU 12 for use in the algorithm. As evident from FIG. 4, these parameters include desired frequency f at which the clock signals CLK1, CLK2 are to be generated, reference frequency $f_{IN}$ at which the reference clock is generated by reference clock circuit 14, the number N of phases that are generated by VCO 37 and applied to integer-flying-adder frequency synthesis circuit 20, and the prescale integer P by which the reference clock is divided by prescale divider 32 in PLL 30. These parameters 60 that are retrieved in process 62 are used in the derivation of integers M and FREQ according to this embodiment of the invention.

In process 64, CPU 12 initializes error parameter error_min to a large value. Parameter error_min corresponds to a measure of the best frequency error value achieved for a given desired frequency f, and as such initialization process 64 sets this to an initial high value so that the best iteration through the process of FIG. 4 will be retained. In process 66, trial integer value M is initialized to lower limit $M_1$ of the integer range $M_1$ to $M_2$ that are to be analyzed according to this embodiment of the invention.

The iterative optimization of integer values M and FREQ begins in process 68 with the calculation of a trial value freq using the retrieved parameters N, f, and P from process 62, and the current trial integer value M, based on equation (15) rewritten to solve for freq as follows:

$$freq = \left(\frac{N * f_{in}}{f * P}\right) M \quad (16)$$

This calculation of process 68 will derive a floating-point (i.e., integer and fraction) value for trial value freq. The difference between trial value freq and the nearby integer values of digital word FREQ is analyzed according to this embodiment of the invention.

In process 70, an error parameter error is derived by comparing the trial value freq to its near neighbor integer values FREQ. According to this embodiment of the invention, a floor function is applied to current trial value freq as follows:

$$\text{floor}(freq) = \text{int}(freq) \quad (17a)$$

and a ceiling function is applied as follows:

$$\text{ceiling}(freq) = \text{int}(freq) + 1 \quad (17b)$$

In other words, the floor and ceiling values correspond to the integer values of digital word FREQ that are on the low and high sides of current trial value freq. In process 70, therefore, error parameter error determines the minimum difference between the current trial value freq and its floor and ceiling values floor(freq), ceiling(freq), respectively:

$$error = \min(freq - \text{floor}(freq), \text{ceiling}(freq) - freq) \quad (18)$$

Optionally, at this point, CPU 12 may test the value of error to determine whether it exactly equals zero. If so, the evaluation of additional trial values for integer M can be stopped. The current values of integer M can be stored as best integer value $M_{best}$, the corresponding value of best frequency word value $FREQ_M$ can be generated as described below, and control can pass to process 80, also described below.

In decision 71, CPU 12 determines whether the current value of error parameter error is less than the current value of parameter error_min. If not (decision 71 is NO), then analysis of the current trial integer M is complete. Decision 77 is then executed to determine whether all trial values of integer M have been evaluated, by comparing current trial integer M against the upper limit $M_2$. If additional values remain to be analyzed (decision 77 is NO), then the current trial integer M is incremented in process 78, and control passes back to calculation process 68.

On the other hand, if the current value of error parameter error is less than the current value of parameter error_min (decision 71 is YES), then this current value of error parameter error indicates that the current trial integer M provides the best performance so far, from the standpoint of frequency accuracy to the desired frequency f. In process 72, best integer value $M_{best}$ is set to the current value of trial integer M. Decision 73 is then executed by CPU 12 to determine whether the current trial value freq is closer to its floor near neighbor integer value, or to its ceiling near neighbor integer value. An example of process 73 in this embodiment of the invention performs decision 73 by evaluating the statement:

$$freq - \text{floor}(freq) < 0.5 \quad (19)$$

If this statement is true, considering that the values of floor(freq) and ceiling(freq) differ by one, then the current trial value freq is closer to the floor near neighbor and decision 73 returns FLOOR. In this event, CPU 12 executes process 74 to set the current best frequency word value $FREQ_M$ to the value returned by the function floor(freq). Conversely, if the statement of equation (19) is false, the current trial value freq is closer to the ceiling near neighbor and decision 73 returns CEILING, in which case CPU 12 executes process 76 to set the current best frequency word value $FREQ_M$ to the value returned by the function ceiling (freq). Control then passes to decision 77, for determination of whether all possible trial values of integer M have been analyzed in this fashion. If trial values M remain (decision 77 is NO), control passes back to process 68 for analysis of the next trial value M, incremented in process 78.

Upon completion of the process for all trial values M in the range from lower limit $M_1$ to upper limit $M_2$ (decision 77 is YES), CPU 12 executes process 80 to apply the current best integer value $M_{best}$ to feedback divider 38 in PLL 30, and executes process 82 to apply the current best frequency word value $FREQ_M$ to integer-flying-adder frequency synthesis circuit 20. Operation of PLL 30 and integer-flying-adder frequency synthesis circuit 20 can then commence, producing output clock signals CLK1, CLK2 at frequency $f_z$ as follows:

$$f_z = \left(\frac{N * f_{in}}{P}\right)\left(\frac{M_{best}}{FREQ_M}\right) \quad (20)$$

It is contemplated that this frequency $f_z$ will closely approximate, or equal (when error_min=0), the desired frequency f, as will be described in further detail below. Because of the construction of integer-flying-adder frequency synthesis circuit 20 described above, however, which accumulates only using integer values for selecting PLL clock phases, there is no jitter in the output clock signals CLK1, CLK2 at this frequency $f_z$, thus producing a stable high-precision clock.

It is contemplated that, because of the programmability of feedback divider 38 in PLL 30, the design of PLL 30 itself may require some tradeoffs in its loop bandwidth characteristics. This is in contrast to phase-locked loops that operate at a single fixed frequency, for which the loop dynamics can be optimized for stability and jitter reduction. It is further contemplated that the programmable PLL 30 according to the preferred embodiment of the invention can be readily optimized for use in connection with this invention, using conventional techniques that are well-known in the art. It is therefore contemplated that those skilled in the art using these and other conventional techniques and having reference to this specification will be readily able to construct an optimized phase-locked loop in connection with this invention, for the particular desired frequencies and system applications.

One may derive an upper bound for the frequency error achievable according to this preferred embodiment of the invention. Consider fraction r as equal to the error parameter evaluated in connection with decision 73:

$$r = \min(freq - \text{floor}(freq), \text{ceiling}(freq) - freq) \quad (21)$$

then the maximum value of r is:

$$r \leq \frac{1}{2}\left(\frac{f_{in} * N}{f * P}\right) \qquad (22)$$

considering that the step between floor(freq) and ceiling (freq) is one, and considering equation (16) and that integer M is in increments of one. To derive the frequency error, consider integer I as the nearest integer to the true value freq, in which case the true period T can be expressed as:

$$T = freq * \Delta = (I \pm r)\Delta \qquad (23a)$$

and the output approximated period T' is:

$$T' = FREQ * \Delta = I * 66 \qquad (23b)$$

The frequency error can thus be termed as the difference between the approximated and true periods, divided by the true period:

$$\frac{|T - T'|}{T} = \frac{r * \Delta}{(I \pm r)\Delta} = \frac{r}{I \pm r} \qquad (24)$$

The fractional part r is determined by equation (22); while I±r can be derived from:

$$I \pm r = \frac{T}{\Delta} = \frac{1}{f * \Delta} = \frac{(f_{in} * N)}{(f * P)} M \qquad (25)$$

using equations (13) and (23a). Including these expressions into equation (24) provides an upper bound for the frequency error:

$$\frac{|T - T'|}{T} \leq \frac{1}{2}\left(\frac{1}{M}\right) \qquad (26)$$

which is at its maximum, worst case, frequency error at lower limit $M_1$:

$$\frac{|T - T'|}{T} \leq \frac{1}{2M_1} \qquad (27)$$

It has been observed, however, that the actual frequency error according to the preferred embodiment of the invention is much less than this upper bound. One may evaluate each of the possible generated frequencies $f_z$ that may be attained for each possible digital frequency select word FREQ (e.g., all integer values from 2 to 64, inclusive) over each integer value M from lower limit $M_1$ to upper limit $M_2$. The number k of generated frequencies is thus:

$$k = (64 - 2 + 1) * (M_2 - M_1 + 1) \qquad (28)$$

Figure 5:
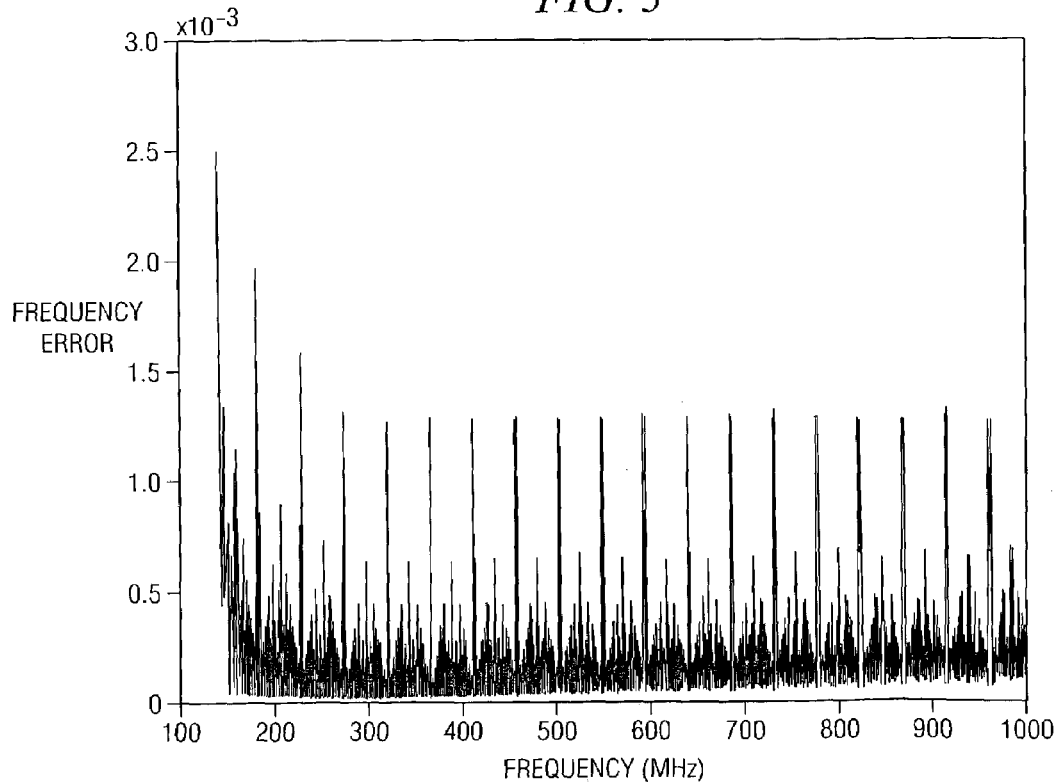
FIG. 5 is a plot of the frequency error distribution envelope for an exemplary implementation of the preferred embodiment of the invention.

Each of these k generated frequencies are thus directly available in a given system, and will be the generated frequencies for those selected frequencies f that are nearby. One can then derive a distribution envelope of error over all frequencies f and its nearest one of the k frequencies. FIG. 5 is an example of such an error distribution envelope, for frequencies ranting from about 143 MHz to 1000 MHz, for the case of N=32, P=10, $f_{in}$=14.31818 MHz, lower limit $M_1$=200, and upper limit $M_2$=400. This error distribution envelope can be mathematically proven. As evident from FIG. 5, the worst case error frequencies are very sharp peaks, with the error at most other frequencies being much less than the worst case error values. Accordingly, the clock generation scheme according to the preferred embodiment of the invention is extremely accurate over many frequencies, while providing jitter-free performance at each.

It is possible, of course, that the desired frequency f happens to correspond to one of the worst-case error frequencies in the distribution. However, the error distribution, for example the distribution of FIG. 5, is established for a given value of prescale divider P; a different value of prescale divide integer P will result in different values of feedback divide integer M and digital frequency select word FREQ, and likely a different frequency error value for the same desired frequency f. If the resulting frequency error cannot be tolerated in the system, it is likely that selection of a different prescale integer P, and repetition of the process of selecting feedback divide integer M and digital frequency select word FREQ as described above relative to FIG. 4, will result in a lower frequency error, simply because the worst case frequency error values are relatively rare, and confined to sharp peaks as shown in FIG. 5.

As mentioned above, the frequency error is bounded so long as the evaluation of equation (16) crosses an "integer boundary" at least once as it is iterated from lower limit $M_1$ to upper limit $M_2$ (or vice versa). This constrains the selection of the lower limit $M_1$ and upper limit $M_2$. It is therefore preferred to determine the minimum range of feedback divide integer M for a given set of system conditions, to ensure that the frequency error is bounded, as will now be described.

Equation (16) provides a way of relating digital frequency word freq to feedback integer M:

$$freq = \left(\frac{N * f_{in}}{f * P}\right) M \qquad (16)$$

Partial differentiation of both sides provides:

$$\partial freq = \left(\frac{N * f_{in}}{f * P}\right) \partial M \qquad (29)$$

The crossing of an "integer boundary" in the iterative evaluation of equation (16) is satisfied if $\partial freq \geq 1$ for any $\partial M$ within the range between lower limit $M_1$ and upper limit $M_2$. In other words, the frequency error is bounded for:

$$\partial M = M_2 - M_1 \geq \left(\frac{P * f}{f_{in} * N}\right) \qquad (30)$$

For example, in the case of prescale integer P=10, number of PLL phases N=32, reference frequency $f_{in}$=14.31818 MHz, and desired frequency f of up to 1000 MHz, the difference between upper limit $M_2$ and lower limit $M_1$ must be at least 21.83. A larger value of feedback integer M will provide a lower worst case error, according to equation (27). Accordingly, for a lower limit $M_1$ of 200, the upper limit $M_2$ must be at least 222.

Figure 6:
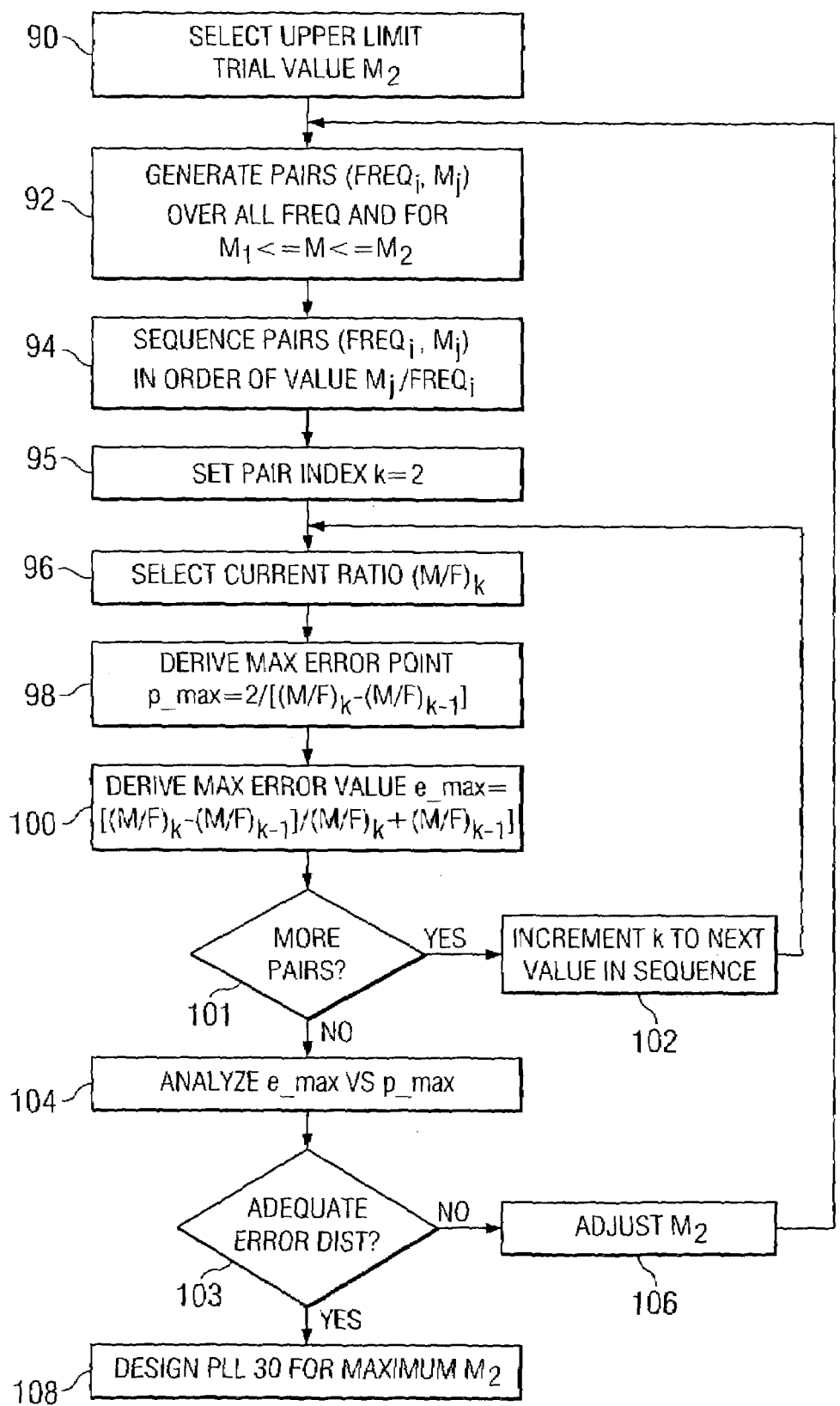
FIG. 6 is a flow chart illustrating a design methodology for selecting a range of potential feedback divide integers, according to a preferred embodiment of the invention.

According to this invention, it is also useful to investigate the error distribution in order to design the value of upper limit $M_2$, and accordingly to design PLL 30. Referring now to FIG. 6, a method of designing PLL 30 according to the preferred embodiment of the invention, particularly in determining the available values for feedback frequency divider 38 by analyzing the frequency error distribution, will now be described. It is contemplated that the method of FIG. 6 will be performed by a computer or workstation utilized in the design of PLL 30 in system 10. Alternatively, it is contemplated that the method of FIG. 6 may be performed by CPU 12 in system 10, for example in deriving its operational parameters for a particular application. It is contemplated that these and other applications of this method will be apparent to those skilled in the art having reference to this specification.

In process 90, an initial trial value of upper limit $M_2$ is selected. For purposes of this description, the lower limit $M_1$ will remain fixed, and as such this method will effectively analyze the overall range $M_1$ $_{to\ M2}$ of the feedback integer M. In process 92, all possible pairs of digital frequency select word FREQ and feedback divide integer M are generated, with this number of pairs corresponding to that given by equation (28). For example, the number of available digital frequency select word values $FREQ_i$ may vary from 2 to 64, while the number of feedback divide integers $M_j$ will be defined by the difference between the lower and upper limits $M_1$, $M_2$ and the step size (which is typically one).

In process 94, the pairs generated in process 92 are resequenced, with the sequence corresponding to increasing values of the ratio M/FREQ. As indicated by equation (15), the ratio M/FREQ is directly proportional to an output frequency $f_z$. As a result of process 94, a sequence of ratios $(M/F)_k$ with increasing value is produced, corresponding to increasing frequency f Index k corresponds to the index of these ratios, and increases with increasing value of the corresponding ratio (i.e., $(M/F)_k>(M/F)_{k-1}$). This sequence is used to generate the frequency error distribution, according to this embodiment of the invention. In process 95, the index k is initialized to 2, where the first ratio $(M/F)_1$ is the lowest-valued ratio (i.e., based on the lower limit value $M_1$ and the highest value of FREQ).

In process 96, the ratio $(M/F)_k$ for the current value of index k is selected. From equation (15), if the desired frequency f corresponds to the output frequency $f_z$ generated by any one of the ratios $(M/F)_k$, the frequency error will, of course, be zero. On the other hand, for desired frequencies that do not correspond exactly to a ratio $(M/F)_k$, some frequency error will result because the actual output frequency will correspond to the nearer of the adjacent ratios $(M/F)_k$. It has been discovered, according to this invention, that a frequency point p_max located between two adjacent ratio values $(M/F)_k$ and $(M/F)_{k-1}$ and at which the frequency error is its highest is given by:

$$p\_max = \frac{2}{\left[\left(\frac{M}{F}\right)_k + \left(\frac{M}{F}\right)_{k-1}\right]} \quad (31)$$

and the maximum frequency error e_max at this point p_max is given by:

$$e\_max = \frac{\left|\left(\frac{M}{F}\right)_k - \left(\frac{M}{F}\right)_{k-1}\right|}{\left[\left(\frac{M}{F}\right)_k + \left(\frac{M}{F}\right)_{k-1}\right]} \quad (32)$$

In process 98, the maximum frequency error point p_max is derived for the current ratio $(M/F)_k$, and in process 100 the maximum frequency error value e_max is derived for the current ratio $(M/F)_k$.

Decision 101 determines whether additional pairs (ratios) remain to be analyzed. If so (decision 101 is YES), index k is incremented in process 102, and the selection and evaluation processes 96, 98, 100 are repeated for the next ratio $(M/F)_k$. Upon completion of all pairs (decision 101 is NO), control passes to process 104 in which the results are analyzed.

According to the preferred embodiment of the invention, the error distribution can be analyzed by generating a plot of the frequency error envelope over frequency based on the results of processes 98, 100 for the entire sequence of ratios $(M/F)_k$. The process of FIG. 6 determines zero error points, at frequencies corresponding to each of the ratios $(M/F)_k$, and also the maximum frequency error e_max at each point p_max between each pair of adjacent ratios $(M/F)_k$. The plot may be constructed to show actual frequencies, by inserting the appropriate values for the parameters of number of phases N, prescale divide integer P, input reference frequency $f_{in}$, into equation (15). By plotting a straight line between these points, this plot will correspond to a frequency error envelope, because the actual frequency error is contemplated to fall at or below the piecewise linear plot. Various methods can be used for analysis process 104. For example, a human designer can analyze printed or graphically displayed plots of frequency error versus frequency, to determine an acceptable error distribution. FIG. 5 is an example of such a plotted frequency error envelope. Alternatively, an automated degree-of-goodness can be calculated for the frequency error distribution, for example by calculating a statistic such as root-mean-square error.

Decision 103 is then performed to determine whether the frequency error distribution analyzed in process 104 is adequate for the desired system implementation. If not, upper limit $M_2$ is adjusted (generally upwardly) in process 106, and the process is repeated by generating a new sequence of pairs $(FREQ_i, M_j)$ in process 92, and then producing the new frequency error distribution. Upon an adequate error distribution performance being attained (decision 103 is YES), PLL 30 can be designed to accommodate the upper limit $M_2$ determined in the process of FIG. 6, according to this embodiment of the invention, in process 108. PLL 30 can then be constructed, according to this design, in the conventional manner for integrated circuit devices.

Figure 7A:
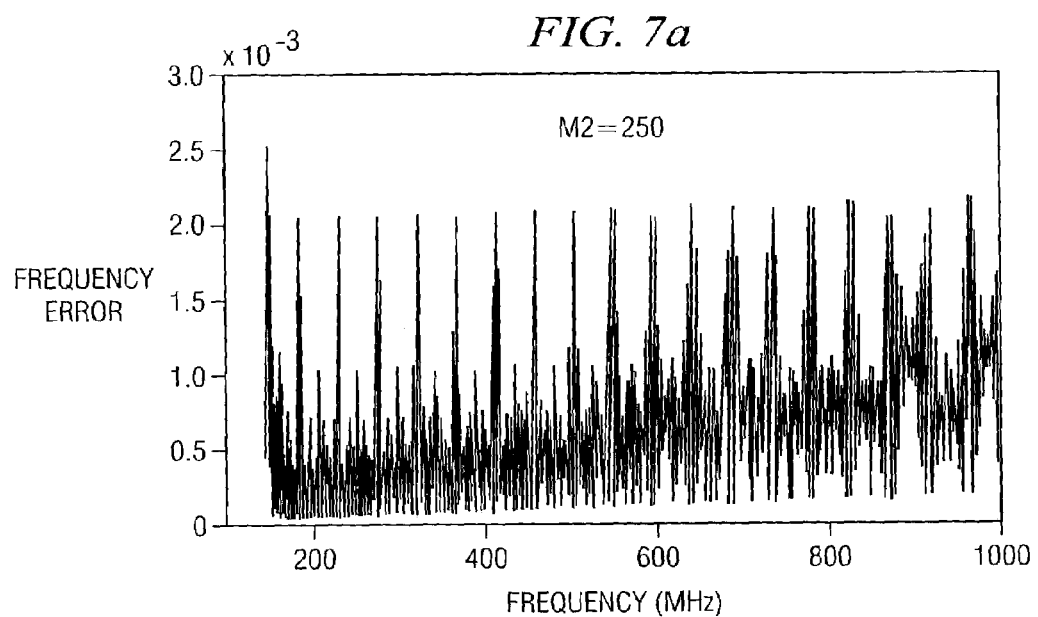
FIGS. 7a and 7b are plots of the frequency error distribution envelope for varying frequency divide integer upper limits, according to the preferred embodiment of the invention.
Figure 7B:
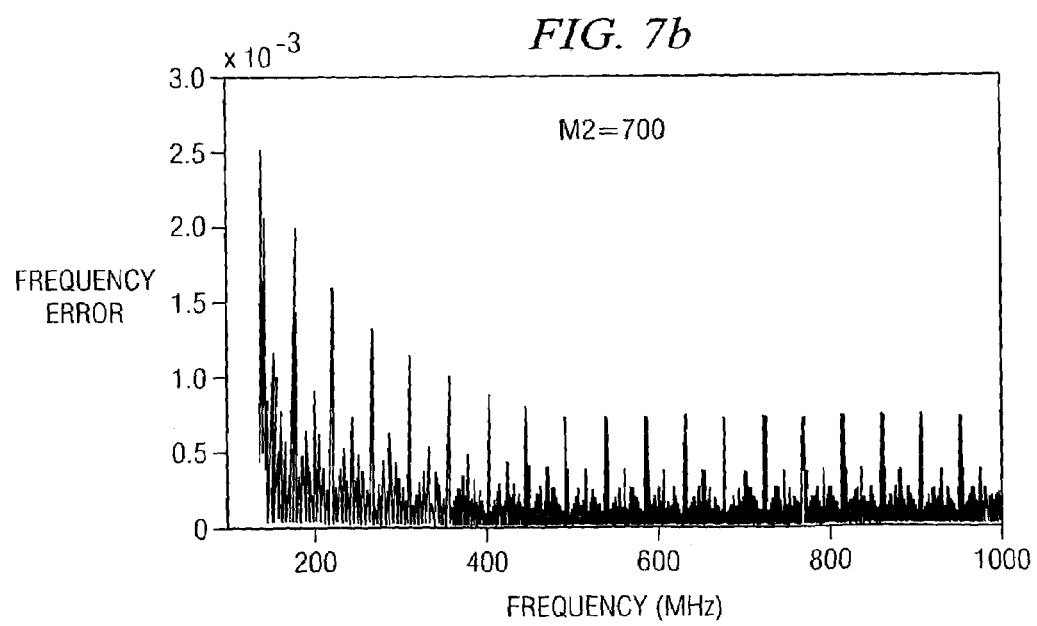

It is contemplated that the frequency error envelope will typically improve dramatically as the upper limit $M_2$ increases. For example, the frequency error envelope of FIG. 5 corresponds to an upper limit $M_2$ of 400, using a lower limit $M_1$ of 200. FIG. 7a illustrates a frequency error envelope using an upper limit $M_2$ of 250, and FIG. 7b illustrates a frequency error envelope using an upper limit $M_2$ of 700; both plots of FIGS. 7a and 7b use a lower limit $M_1$ of 200. As evident from a comparison of FIGS. 7a and 7b, in combination with FIG. 5, the higher value of upper limit $M_2$, and the corresponding wider range for feedback integer M, results in significantly better frequency error performance. Accordingly, decision 103 of the process of FIG. 6 will determine whether the most recently generated frequency error envelope is adequate, considering other design constraints such as the design rules for the construction of PLL 30, the necessary frequency precision for system 10, and the like. As such, while the frequency error envelope will improve with increasing values of upper limit $M_2$, practical considerations will ultimately result in a desired value for this limit. However, this embodiment of the invention provides a methodology by way of which the frequency error envelope can be optimized for a given system implementation.

As previously mentioned, the selection of the integer parameters including the feedback integer M, digital frequency select word FREQ, and also optionally the prescale integer P, can be carried out by CPU 12 or other logic in the system in response to a command to generate a particular frequency. Alternatively, the integer parameters can be derived prior to manufacture of system 10, and realized by way of look-up table 13, such that CPU 12 can arrive at the appropriate integer parameters by applying an address to look-up table 13, corresponding to the desired frequency, with look-up table 13 returning the integer parameters stored in its memory that correspond to the desired frequency. It is contemplated that these approaches, and modifications and variations thereto, will be apparent to those skilled in the art having reference to this specification.

According to the preferred embodiment of the invention, a clock generation circuit and subsystem is provided, in which the output clock signal can be derived at a selected frequency, with minimum error relative to the selected frequency, and with substantially no jitter in the generated clock signals. A method of selecting the optimum control parameters for this clock generation is provided, with this method ensuring that the frequency error has an upper bound. Furthermore, the frequency synthesis and parameter selection according to this invention results in a frequency error distribution that is significantly less than the upper bound for many of the available frequencies. This invention also provides a method of evaluating the frequency error envelope, to determine the proper range of parameters to be evaluated in deriving the integer values used to generate the jitter-free clock signals.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A clock generation circuit, comprising:
    a phase-locked loop for generating a plurality of clock phases, the phase-locked loop comprising:
    a voltage controlled oscillator, for generating a plurality of clock phases at a frequency controlled by a control input to the voltage controlled oscillator;
    circuitry for generating the control input to the voltage controlled oscillator responsive to phase differences between a reference clock signal and a feedback clock signal; and
    a feedback frequency divider, for generating the feedback clock signal from one of the clock phases generated by the voltage controlled oscillator, divided by a feedback integer value;
    a frequency synthesis circuit, comprising:
    a first multiplexer, for forwarding a selected one of the plurality of clock phases responsive to a first select signal;
    a second multiplexer, for forwarding a selected one of the plurality of clock phases responsive to a second select signal;
    a first adder leg, having an input for receiving at least a portion of a frequency select integer word, for generating the first select signal corresponding to a sum of the received portion of the frequency select integer word and a accumulated value;
    a second adder leg, having an input for receiving at least a portion of the frequency select integer word, for generating the second select signal corresponding to a sum of the received portion of the frequency select integer word and a accumulated value; and
    circuitry coupled to the first and second outputs of the first and second multiplexers, for generating an output clock signal responsive to the selected clock phases.

2. The circuit of claim 1, further comprising circuitry for applying the frequency select integer word to the frequency synthesis circuit, and for applying the feedback integer value to the feedback frequency divider, corresponding to a desired frequency for the output clock signal.

3. The circuit of claim 2, wherein the applying circuit is also for generating the frequency select integer word and the feedback integer value responsive to the desired frequency.

4. The circuit of claim 3, wherein the applying circuit comprises:
    programmable logic, programmed to execute a sequence of operations comprising:
    for each of a plurality of trial values of the feedback integer, calculating a frequency value responsive to the desired frequency, the trial value of the feedback integer, and the number of clock phases in the plurality of clock phases;
    then generating a frequency error value by comparing the calculated frequency value to adjacent frequency select integer words;
    selecting the feedback integer value from the trial value of the feedback integer corresponding to the minimum frequency error value; and
    selecting the frequency select integer word responsive to the selected feedback integer value.

5. The circuit of claim 4, wherein the programmable logic is a central processing unit.

6. The circuit of claim 3, wherein the applying circuit comprises:
    a look-up table, for storing values of the frequency select integer word and the feedback integer value for each of a plurality of desired frequencies.

7. The circuit of claim 1, wherein the output clock signal generating circuitry comprises:
    a toggle multiplexer, having first and second inputs coupled to the outputs of the first and second multiplexers, for toggling a selection of its inputs in sequence; and
    a multivibrator, having a clock input coupled to an output of the toggle multiplexer, for inverting an output of the multivibrator responsive to a transition at its clock input.

8. The circuit of claim 1, wherein the phase-locked loop further comprises:
a prescale divider, for receiving a reference clock at an input, and for generating the reference clock signal by dividing the reference clock by a prescale integer value.

9. The circuit of claim 8, further comprising circuitry for applying the frequency select integer word to the frequency synthesis circuit.

10. The circuit of claim 9, wherein the applying circuit is also for generating the frequency select integer word.

11. A method of synthesizing one or more clock signals of a selected frequency, comprising the steps of:
for the selected frequency, determining a frequency select integer word and a frequency divide integer;
generating a plurality of clock phases from a phase-locked loop, the phase-locked loop including a frequency divider for dividing a clock signal by the frequency divide integer so that the plurality of clock phases are at a frequency determined by the frequency divide integer;
adding at least a portion of the frequency select integer word to an accumulated integer to generate a first select value;
selecting a first one of the plurality of clock phases according to the first select value;
adding at least a portion of the frequency select integer to an accumulated integer to generate a second select value;
selecting a second one of the plurality of clock phases according to the second select value; and
generating the output clock signal from the first and second selected ones of the plurality of clock phases.

12. The method of claim 11, wherein the frequency divide integer is a feedback divide integer;
and wherein the frequency divider in the phase-locked loop is a feedback frequency divider.

13. The method of claim 12, wherein the step of determining a frequency select integer word and a frequency divide integer comprises:
for each of a plurality of trial values of the feedback divide integer, calculating a frequency value responsive to the desired frequency, the trial value of the feedback divide integer, and the number of clock phases in the plurality of clock phases;
then generating a frequency error value by comparing the calculated frequency value to adjacent frequency select integer words;
selecting the feedback integer value from the trial value of the feedback integer corresponding to the minimum frequency error value; and
selecting the frequency select integer word responsive to the selected feedback integer value.

14. The method of claim 13, wherein the plurality of trial values of the feedback divide integer comprises a sequence of integer values between a lower limit and an upper limit.

15. The method of claim 13, further comprising:
adjusting a prescale integer value to be applied to a prescale frequency divider in the phase-locked loop; and
repeating the calculating, generating, and selecting steps.

16. An electronic system, comprising:
system functions, coupled to receive a system clock signal at a desired frequency;
a reference clock circuit, for generating a reference clock;
a control circuit; and
a clock generator circuit, comprising:
a phase-locked loop for generating a plurality of clock phases, the phase-locked loop comprising:
a voltage controlled oscillator, for generating a plurality of clock phases at a frequency controlled by a control input to the voltage controlled oscillator;
circuitry for generating the control input to the voltage controlled oscillator responsive to phase differences between a reference clock signal based on the reference clock, and a feedback clock signal; and
a feedback frequency divider, for generating the feedback clock signal from one of the clock phases generated by the voltage controlled oscillator, divided by a feedback integer value applied by the control circuit; and
a frequency synthesis circuit for generating the system clock signal from the plurality of clock phases, responsive to a frequency select integer word applied by the control circuit.
wherein the frequency circuit comprises:
a first multiplexer, for forwarding a selected one of the plurality of clock phases responsive to a first select signal;
a second multiplexer, for forwarding a selected one of the plurality of clock phases responsive to a second select signal;
a first adder leg, having an input for receiving at least a portion of the frequency select integer word, for generating the first select signal corresponding to a sum of the received portion of the frequency selectinteger word and a accumulated value.

17. The system of claim 16, wherein the control circuit is for generating the frequency select integer word and the feedback integer value responsive to the desired frequency.

18. The system of claim 17, wherein the control circuit comprises programmable logic, programmed to execute a sequence of operations comprising:
for each of a plurality of trial values of the feedback integer, calculating a frequency value responsive to the desired frequency, the trial value of the feedback integer, and the number of clock phases in the plurality of clock phases;
then generating a frequency error value by comparing the calculated frequency value to adjacent frequency select integer words;
selecting the feedback integer value from the trial value of the feedback integer corresponding to the minimum frequency error value; and
selecting the frequency select integer word responsive to the selected feedback integer value.

19. The system of claim 17, wherein the control circuit comprises:
a look-up table, for storing values of the frequency select integer word and the feedback integer value for each of a plurality of desired frequencies.

20. The system of claim 16, wherein the output clock signal generating circuitry comprises:
a toggle multiplexer, having first and second inputs coupled to the outputs of the first and second multiplexers, for toggling a selection of its inputs in sequence; and
a multivibrator, having a clock input coupled to an output of the toggle multiplexer, for inverting an output of the multivibrator responsive to a transition at its clock input.

21. The system of claim 16, wherein the phase-locked loop further comprises:
a prescale divider, for receiving a reference clock at an input, and for generating the reference clock signal by dividing the reference clock by a prescale integer value.

22. The system of claim 21, wherein the control circuit is for generating the frequency select integer word and the prescale integer value responsive to the desired frequency.

23. A method of constructing a frequency synthesis circuit, comprising the steps of:
selecting a range of digital frequency integers;
selecting a first upper limit and a lower limit for a feedback divide integer;
generating a plurality of ratios of feedback divide integer to digital frequency integer, the plurality of ratios including each possible ratio of the range of digital frequency integers and a range of feedback divide integers defined by the first upper limit and the lower limit;
ordering the plurality of ratios by value;
for each of adjacent ordered ratios, determining a maximum frequency error point and a maximum frequency error value;
analyzing the results of the determining steps;
repeating the generating, ordering, determining, and analyzing step for a plurality of upper limits;
responsive to the repeated analyzing steps, selecting one of the plurality of upper limits; and
manufacturing a frequency synthesis circuit including a phase-locked loop for generating a plurality of clock phases, the phase-locked loop comprising:
a voltage controlled oscillator, for generating a plurality of clock phases at a frequency controlled by a control input to the voltage controlled oscillator;
circuitry for generating the control input to the voltage controlled oscillator responsive to phase differences between a reference clock signal and a feedback clock signal; and
a feedback frequency divider, for generating the feedback clock signal from one of the clock phases generated by the voltage controlled oscillator, divided by a feedback integer value that ranges from the lower limit to the selected one of the plurality of upper limits.

24. The method of claim 23, wherein the analyzing step comprises:
plotting a frequency error distribution envelope, having an axis for frequency, and having an axis for frequency error, the frequency error having zero value points at frequencies corresponding to the ratios of feedback divide integer to digital frequency integer, and having frequency error value points corresponding to the maximum frequency error values at corresponding maximum frequency error points.

25. The method of claim 24, further comprising:
after the analyzing step, determining whether to repeat the generating, ordering, determining, and analyzing step responsive to the results of the analyzing step.

26. The method of claim 23, wherein the frequency synthesis circuit further comprises:
a frequency synthesis circuit, comprising:
a first multiplexer, for forwarding a selected one of the plurality of clock phases responsive to a first select signal;
a second multiplexer, for forwarding a selected one of the plurality of clock phases responsive to a second select signal;
a first adder leg, having an input for receiving at least a portion of a frequency select integer word selected from the plurality of digital frequency integers, for generating the first select signal corresponding to a sum of the received portion of the frequency select integer word and a accumulated value;
a second adder leg, having an input for receiving at least a portion of the frequency select integer word, for generating the second select signal corresponding to a sum of the received portion of the frequency select integer word and a accumulated value; and
circuitry coupled to the first and second outputs of the first and second multiplexers, for generating an output clock signal responsive to the selected clock phases.

* * * * *